Figure 1:
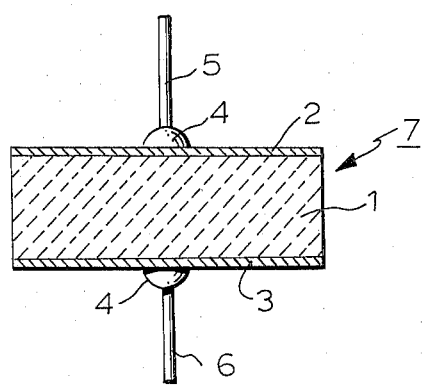

United States Patent [19]

Ouchi et al.

[11] 4,392,970
[45] Jul. 12, 1983

[54] PIEZOELECTRIC CERAMICS

[75] Inventors: Hiromu Ouchi, Toyonaka; Masamitsu Nishida, Osaka; Kazunori Numata, Moriguchi, all of Japan

[73] Assignee: Matsushita Electric Industrial Co., Ltd., Japan

[21] Appl. No.: 345,530

[22] Filed: Feb. 3, 1982

Related U.S. Application Data

[63] Continuation of Ser. No. 49,969, Jun. 19, 1979, abandoned, which is a continuation of Ser. No. 671,980, Mar. 30, 1976, abandoned, which is a continuation of Ser. No. 495,127, Aug. 5, 1974, abandoned.

[30] Foreign Application Priority Data

Sep. 4, 1973 [JP] Japan ................................. 48-100041

[51] Int. Cl.$^3$ ............................................. C04B 35/49
[52] U.S. Cl. ................................................. 252/62.9
[58] Field of Search ....................... 252/62.9; 501/134

[56] References Cited

U.S. PATENT DOCUMENTS

| | | | |
|---|---|---|---|
| 3,518,199 | 6/1970 | Tsubouchi et al. | 252/62.9 |
| 3,528,918 | 9/1970 | Nishida et al. | 252/62.9 |
| 3,595,795 | 7/1971 | Tsubouchi et al. | 252/62.9 |
| 3,970,572 | 7/1976 | Ogawa et al. | 252/62.9 |

FOREIGN PATENT DOCUMENTS 1580831  9/1969  France ............................... 252/62.9

Primary Examiner—Jack Cooper
Attorney, Agent, or Firm—Wenderoth, Lind & Ponack

[57] ABSTRACT

Ceramic materials within particular ranges of the ternary system $Pb(Sn_{\frac{1}{3}}Sb_{\frac{2}{3}})$ $O_3$-$PbTiO_3$-$PbZrO_3$ in solid solution form exhibit high planar coupling coefficient along with high dielectric constant, and are useful in electromechanical transducers. The ceramic materials are those within the area A, B, C, D, E and F of FIG. 2.

6 Claims, 2 Drawing Figures

PIEZOELECTRIC CERAMICS

This is a continuation of application Ser. No. 49,969, filed June 19, 1979, now abandoned, which is a continuation of Ser. No. 671,980, filed Mar. 30, 1976, now abandoned, which is a continuation of Ser. No. 495,127, filed Aug. 5, 1974, now abandoned.

This invention relates to piezoelectric ceramic compositions and articles of manufacture fabricated therefrom. More particularly, this invention pertains to novel ferroelectric ceramics which are polycrystalline aggregates of certain constituents. These piezoelectric compositions are sintered to ceramics by ordinary ceramic techniques and thereafter the ceramics are polarized by applying a D-C voltage between electrodes to impart thereto electromechanical transducing properties similar to the well known piezoelectric effect. This invention also encompasses the calcined product of raw ingredients and the articles of manufacture such as electromechanical transducers fabricated from the sintered ceramic.

The ceramic bodies materialized by this invention exist basically as the ternary system:

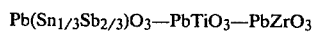

$Pb(Sn_{1/3}Sb_{2/3})O_3$—$PbTiO_3$—$PbZrO_3$ in solid solution form.

The use of piezoelectric materials in various transducer applications in the production, measurement and sensing of sound, shock, vibration, pressure, etc. has increased greatly in recent years. Both crystal and ceramic type of transducers have been widely used. But, because of their potentially lower cost and facility in the fabrication of ceramics with various shapes and sizes and their greater durability for high temperature and/or for humidity than those of crystalline substances such as Rochelle salt, piezoelectric ceramic materials have recently achieved importance in various transducer applications.

The piezoelectric characteristics of ceramics required apparently vary with species of applications. For example, electromechanical transducers such as phonograph pickups, microphones and voltage generators in ignition systems require piezoelectric ceramics characterized by a substantially high electromechanical coupling coefficient and dielectric constant. On the other hand, it is desired in filter application of piezoelectric ceramics that the materials exhibit high stability with temperature and time in resonant frequency and in other electrical properties.

As more promising ceramics for these requirements, lead titanate-lead zirconate is in wide use so far. However, it is difficult to get a high planar coupling coefficient along with high dielectric constant in the lead titanate-lead zirconate ceramics. And the piezoelectric and dielectric properties of the lead titanate-lead zirconate ceramics change greatly with a change of firing technique which is ascribable to evaporation of PbO.

It is, therefore, a fundamental object of this invention to provide novel and improved piezoelectric ceramic materials which overcome the problems outlined above.

A more specific object of this invention is to provide improved polycrystalline ceramics characterized by high piezoelectric coupling coefficient along with high dielectric constant.

Another object of this invention is the provision of novel piezoelectric ceramic compositions, certain properties of which can be adjusted to suit various applications.

Still another object of this invention is the provision of an improved electromechanical transducer utilizing, as an active element, an electrostatically polarized body of a novel ceramic composition.

A yet further object of the invention is to provide novel piezoelectric ceramics characterized by high time stability of the electrical properties such as dielectric constant and resonant frequency.

Figure 2:
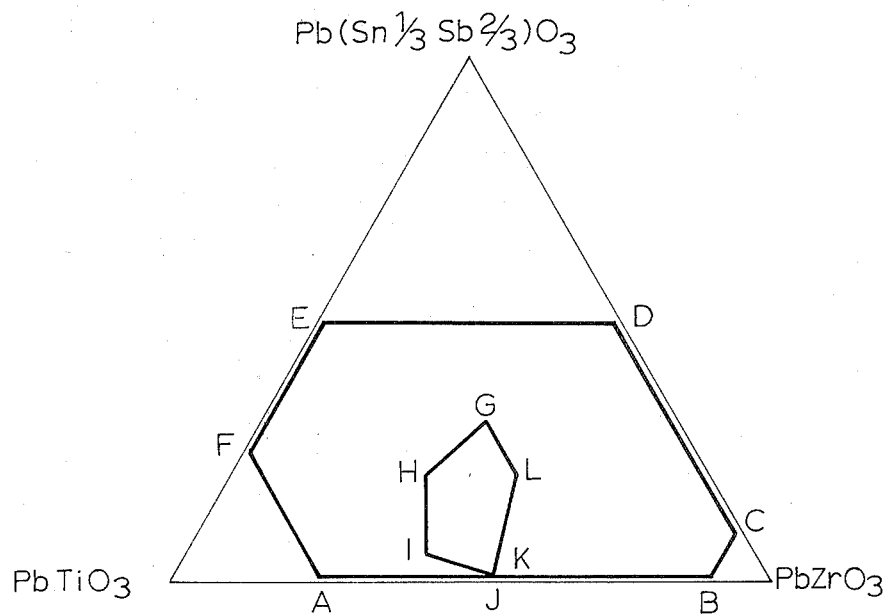

These objects of this invention and the manner of their attainment will be readily apparent from the following description and the accompanying drawings, in which:

FIG. 1 is a cross-sectional view of an electromechanical transducer embodying this invention; and FIG. 2 is a triangular compositional diagram of materials according to this invention.

Before proceeding with a detailed description of the piezoelectric materials contemplated by this invention, their application in electromechanical transducers will be described with reference to FIG. 1. wherein reference character 7 designates, as a whole, an electromechanical transducer having, as its active element, a body 1, preferably disc shaped, of a piezoelectric ceramic material according to this invention. The body 1 is electrostatically polarized, in a manner hereinafter set forth, and is provided with a pair of electrodes 2 and 3 which are applied to two opposed surfaces thereof in a suitable and per se conventional manner. Wire leads 5 and 6 are attached conductively to the electrodes 2 and 3, respectively, by means of solder 4. When the ceramic is subjected to shock, vibration and/or other mechanical stress, the electrical output generated can be taken out from the wire leads 5 and 6. Conversely, as with other piezoelectric transducers, application of electrical voltage to electrodes 5 and 6 will result in mechanical deformation of the ceramic body. It is to be understood that the term electromechanical transducer as used herein is taken in its broadest sense and includes piezoelectric filters, frequency control devices, and the like, and that this invention can also be used for and adapted to various other applications requiring materials having piezoelectric, dielectric and/or electrostrictive properties.

According to this invention, the ceramic body 1, FIG. 1, is formed of a novel piezoelectric composition, which is a polycrystalline ceramic composed of:

$Pb(Sn_{1/3}Sb_{2/3})O_3$—$PbTiO_3$—$PbZrO_3$.

This invention is based on a discovery that within particular ranges of this system, the specimens exhibit a high planar coupling coefficient along with high dielectric constant.

This invention has various advantages in the manufacturing process and in the application for ceramic transducers. It has been known that the evaporation of PbO during firing is a problem in sintering of lead compounds such as lead titanate-zirconate. The inventive composition, however, shows a smaller amount of evaporated PbO than a conventional lead titanate-zirconate does. The inventive compositions can be fired without any particular control of PbO atmosphere. A well sintered body of the composition of this invention is obtained by firing it in a ceramic crucible with a ceramic cover made of $Al_2O_3$ ceramic. A high sintered quality is desirable for humidity resistance and high piezoelectric response when the sintered body is applied to a resonator, etc.

All possible compositions falling within the ternary system:

$$Pb(Sn_{1/3}Sb_{2/3})O_3\text{—}PbTiO_3\text{—}PbZrO_3$$

are represented by the triangular diagram of FIG. 2. Some compositions represented by the diagram, however, do not exhibit high piezoelectricity and high dielectric constant. Many are electromechanically active only to a slight degree and show low dielectric constant. This invention is concerned with those compositions exhibiting piezoelectric response of appreciable magnitude. For convenience sake, the planar coupling coefficient (kp) of test discs will be taken as a measure of piezoelectric activity. Thus, within the area bound by lines connecting points A, B, C, D, E and F in FIG. 2, all compositions polarized and tested showed a planar coupling coefficient of approximately 0.1 or higher. The compositions in the area of the diagram bound by lines connecting points G, H, I, J, K and L in FIG. 2 exhibit a planar coupling coefficient of approximately 0.4 or higher. The molar ratio of the three composition components of A, B, C, D, E, F, G, H, I, J, K and L are as follows:

|   | $Pb(Sn_{\frac{1}{3}}Sb_{\frac{2}{3}})O_3$ | $PbTiO_3$ | $PbZrO_3$ |
|---|---|---|---|
| A | 0.01 | 0.75 | 0.24 |
| B | 0.01 | 0.09 | 0.90 |
| C | 0.09 | 0.01 | 0.90 |
| D | 0.50 | 0.01 | 0.49 |
| E | 0.50 | 0.495 | 0.005 |
| F | 0.25 | 0.745 | 0.005 |
| G | 0.30 | 0.33 | 0.37 |
| H | 0.20 | 0.48 | 0.32 |
| I | 0.05 | 0.55 | 0.40 |
| J | 0.01 | 0.47 | 0.52 |
| K | 0.05 | 0.43 | 0.52 |
| L | 0.20 | 0.33 | 0.47 |

Furthermore, the compositions near the morphotropic phase boundary of the ternary system, particularly of:

$$Pb(Sn_{1/3}Sb_{2/3})_{0.05}Ti_{0.44}Zr_{0.51}O_3$$

$$Pb(Sn_{1/3}Sb_{2/3})_{0.10}Ti_{0.43}Zr_{0.47}O_3$$

give ceramic products having a planar coupling coefficient of 0.71 or higher.

According to this invention, piezoelectric and dielectric properties of the ceramics can be adjusted to suit various applications by selecting the proper composition.

The compositions described herein can be prepared in accordance with various well known ceramic procedures. An advantageous method hereinafter more fully described, however, consists in the use of PbO or $Pb_3O_4$, $SnO_2$ or SnO, $Sb_2O_3$, $TiO_2$ and $ZrO_2$.

The starting materials, viz. lead oxide (PbO), stannic oxide ($SnO_2$), antimony trioxide ($Sb_2O_3$), titania($TiO_2$), zirconia($ZrO_2$) all of relatively pure grade (e.g.,C.P. grade), are intimately mixed in a rubber-lined ball mill with distilled water. In milling the mixture, care should be exercised to avoid, or the proportions of ingredients should be varied to compensate for, contamination by wear of the milling ball or stones.

Following the wet milling, the mixture is dried and mixed to assure as homogeneous a mixture as possible. Thereafter, the mixture is suitably formed into a desired form at a pressure e.g. of 400 kg/cm². The compacts are pre-reacted by calcination at a temperature or around 750° to 900° C. for about 2 hours. After calcination, the reacted material is allowed to cool and is then wet-milled to a small particle size. Once again, care should be exercised to avoid, or the proportions of ingredients should be varied to compensate for, contamination by wear of the milling balls or stones. Depending on preference and the shapes desired, the material is formed into a mix or slip suitable for pressing, slip casting or extruding, as the case may be, in accordance with per se conventional ceramic procedures.

Each of samples for which data are given hereinbelow was prepaered by mixing 100 grams of the milled pre-sintered mixture with 5 cc of distilled water. The mix was then pressed into a disc of 20 mm diameter and 2 mm thickness at a pressure of 700 kg/cm². The pressed disc was fired at 1210°-1310° C. for 45 minutes. According to this invention, there is no need to fire the composition in an atmosphere of PbO and no special care is required for the temperature gradient in the furnace as compared with the prior art. Thus, according to this invention, uniform and excellent piezoelectric ceramic products can be easily obtained simply by covering the samples with an alumina crucible during firing.

Each of the sintered ceramics was polished on both surfaces to the thickness of one millimeter. The polished disc surfaces were then coated with silver paint and fired to form silver electrodes. Finally, each of the discs was polarized while immersed in a bath of silicone oil at 100° C. A voltage gradient of D-C 3 kv per mm. was maintained for one hour, and each of the discs was field-cooled to room temperature in thirty minutes.

The piezoelectric and dielectric properties of the polarized specimen were measured at 20° C. in a relative humidity of 50% and at a frequency of 1 kHz. Examples of specific ceramic compositions thus made according to this invention and various pertinent electromechanical and dielectric properties thereof are given in Table. From Table, it will be readily evident that the exemplary compositions selected from the area bound by lines connecting points A, B, C, D, E and F of the triangular diagram of FIG. 2 are characterized by high planar coupling coefficient along with high dielectric constant.

Especially, the compositions in the area of the diagram bound by lines connecting points G, H, I, J, K and L of FIG. 2 exhibit a planar coupling coefficient of approximately 0.4 or higher along with high dielectric constant. It is also evident from Table that the value of planar coupling coefficient and dielectric constant can be adjusted to suit various applications by appropriately selecting the composition.

TABLE

| Example No. | Molar ratio of composition Pb(Sn₁Sb₃)O₃ $x$ | PbTiO₃ $y$ | PbZrO₃ $z$ | Dielectric constant $\epsilon$, at 1 kHz | Dissipation D, in % at 1 kHz | Planar coupling coeff. kp, % | Mechanical quality factor QM |
|---|---|---|---|---|---|---|---|
| 1 | 0.01 | 0.75 | 0.24 | 280 | 2.6 | 11 | 150 |
| 2 | 0.05 | 0.75 | 0.20 | 320 | 2.5 | 12 | 210 |
| 3 | 0.10 | 0.75 | 0.15 | 350 | 2.2 | 11 | 200 |
| 4 | 0.25 | 0.745 | 0.005 | 380 | 2.9 | 10 | 190 |
| 5 | 0.05 | 0.70 | 0.25 | 350 | 1.8 | 24 | 340 |
| 6 | 0.10 | 0.70 | 0.20 | 340 | 2.3 | 25 | 360 |
| 7 | 0.05 | 0.65 | 0.30 | 420 | 1.9 | 29 | 290 |
| 8* | 0.00 | 0.60 | 0.40 | 300 | 2.4 | — | — |
| 9 | 0.01 | 0.60 | 0.39 | 410 | 2.0 | 32 | 100 |
| 10 | 0.10 | 0.60 | 0.30 | 530 | 1.8 | 35 | 220 |
| 11 | 0.40 | 0.595 | 0.005 | 460 | 2.5 | 15 | 230 |
| 12* | 0.00 | 0.55 | 0.45 | 350 | 1.3 |  | 30 |
| 13 | 0.05 | 0.55 | 0.40 | 650 | 1.7 | 49 | 150 |
| 14 | 0.50 | 0.495 | 0.005 | 290 | 5.0 | 11 | 110 |
| 15* | 0.00 | 0.48 | 0.52 | 1060 | 1.6 | 42 | 250 |
| 16 | 0.05 | 0.48 | 0.47 | 1410 | 2.0 | 61 | 90 |
| 17 | 0.10 | 0.48 | 0.42 | 1250 | 2.1 | 55 | 100 |
| 18 | 0.20 | 0.48 | 0.32 | 960 | 1.8 | 44 | 130 |
| 19 | 0.30 | 0.48 | 0.22 | 580 | 1.7 | 30 | 210 |
| 20 | 0.40 | 0.48 | 0.12 | 360 | 1.8 | 18 | 170 |
| 21 | 0.01 | 0.47 | 0.52 | 1520 | 3.0 | 71 | 70 |
| 22 | 0.05 | 0.44 | 0.51 | 1680 | 1.5 | 72 | 70 |
| 23** | 0.10 | 0.45 | 0.45 | 1650 | 2.2 | 64 | 80 |
| 24 | 0.05 | 0.43 | 0.52 | 700 | 3.1 | 65 | 80 |
| 25 | 0.10 | 0.43 | 0.47 | 1420 | 2.9 | 71 | 70 |
| 26 | 0.20 | 0.43 | 0.37 | 1750 | 2.0 | 56 | 80 |
| 27* | 0.00 | 0.40 | 0.60 | 460 | 3.1 | 30 | 320 |
| 28 | 0.10 | 0.40 | 0.50 | 790 | 3.6 | 56 | 90 |
| 29 | 0.20 | 0.38 | 0.42 | 1220 | 3.2 | 60 | 90 |
| 30 | 0.20 | 0.33 | 0.47 | 780 | 3.5 | 48 | 130 |
| 31 | 0.30 | 0.33 | 0.37 | 1200 | 3.4 | 40 | 170 |
| 32* | 0.00 | 0.30 | 0.70 | 380 | 3.3 | 23 | 380 |
| 33 | 0.40 | 0.30 | 0.30 | 1050 | 3.0 | 29 | 180 |
| 34 | 0.30 | 0.23 | 0.47 | 640 | 4.1 | 28 | 220 |
| 35 | 0.50 | 0.23 | 0.27 | 710 | 4.2 | 20 | 70 |
| 36 | 0.50 | 0.20 | 0.75 | 390 | 3.5 | 29 | 240 |
| 37 | 0.01 | 0.19 | 0.80 | 300 | 4.8 | 24 | 460 |
| 38* | 0.00 | 0.10 | 0.90 | 280 | 3.4 | 10 | 580 |
| 39 | 0.10 | 0.10 | 0.80 | 440 | 3.8 | 22 | 320 |
| 40 | 0.20 | 0.10 | 0.70 | 520 | 4.2 | 22 | 290 |
| 41 | 0.50 | 0.10 | 0.40 | 350 | 1.1 | 10 | 230 |
| 42 | 0.01 | 0.09 | 0.90 | 270 | 4.4 | 16 | 360 |
| 43 | 0.05 | 0.05 | 0.90 | 300 | 3.5 | 17 | 450 |
| 44 | 0.20 | 0.05 | 0.75 | 530 | 4.8 | 15 | 260 |
| 45 | 0.40 | 0.05 | 0.55 | 380 | 4.3 | 28 | 280 |
| 46 | 0.09 | 0.01 | 0.90 | 370 | 2.5 | 11 | 460 |
| 47 | 0.30 | 0.01 | 0.69 | 460 | 5.5 | 12 | 160 |
| 48 | 0.50 | 0.01 | 0.49 | 270 | 5.0 | 11 | 150 |

Note:
Specimens with a single asterisk (*) are outside of the scope of this invention.
In specimen with double asterisk (**), Pb₃O₄ is used instead of PbO as one of the starting materials.

The piezoelectric ceramics of this invention show a high stability of dielectric constant with temperature. For example, in the case of the composition:

$Pb(Sn_{1/3}Sb_{2/3})_{0.05}Ti_{0.44}Zr_{0.51}O_3$ the change in dielectric constant is 36% within the range −40° to 80° C. This property is important to the use of the piezoelectric ceramic composition in filter application. The composition:

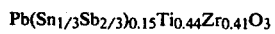
$Pb(Sn_{1/3}Sb_{2/3})_{0.15}Ti_{0.44}Zr_{0.41}O_3$ exhibits high stability of resonant frequency with temperature. The change in resonant frequency is 0.2% within the range −40° to 80° C. This property is also important to the use of the piezoelectric composition in filter application.

According to this invention, the piezoelectric ceramics exhibit high electromechanical coupling coefficient, high dielectric constant and high stability of the electrical properties such as dielectric constant and resonant frequency with temperature. Therefore, the ceramics of this invention are suitable for use e.g. in electromechanical transducer elements such as phonograph pickups, microphones, filter and voltage generators in ignition systems.

In addition to the superior properties shown above, the compositions according to the present invention yield ceramics of good physical quality and which are polarized well.

It will be understood from the foregoing that the ternary ceramics:

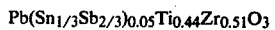
$Pb(Sn_{1/3}Sb_{2/3})_{0.05}Ti_{0.44}Zr_{0.51}O_3$ form an excellent piezoelectric ceramic body.

What is claimed is:
1. A piezoelectric ceramic composition exhibiting high stability of resonant frequency with respect to temperature over the range of −40° C. to 80° C. com- prising a solid solution of a material selected from the area bound by lines connecting points A, B, C, D, E and F of the triangular diagram of FIG. 2, wherein A, B, C, D, E and F respectively have the following formulae:

A: $Pb(Sn_{1/3}Sb_{2/3})_{0.01}Ti_{0.75}Zr_{0.24}O_3$
B: $Pb(Sn_{1/3}Sb_{2/3})_{0.01}Ti_{0.09}Zr_{0.90}hO_3$
C: $Pb(Sn_{1/3}Sb_{2/3})_{0.09}Ti_{0.01}Zr_{0.90}O_3$
D: $Pb(Sn_{1/3}Sb_{2/3})_{0.50}Ti_{0.01}Zr_{0.49}O_3$
E: $Pb(Sn_{1/3}Sb_{2/3})_{0.50}Ti_{0.495}Zr_{0.005}O_3$
F: $Pb(Sn_{1/3}Sb_{2/3})_{0.25}Ti_{0.745}Zr_{0.005}O_3$.

2. The piezoelectric ceramic composition of claim 1 comprising a solid solution of a material selected from the area bound by lines connecting points G, H, I, J, K and L of the triangular diagram of FIG. 2, wherein G, H, I, J, K and L respectively have the following formulae:

G: $Pb(Sn_{1/3}Sb_{2/3})_{0.30}Ti_{0.33}Zr_{0.37}O_3$
H: $Pb(Sn_{1/3}Sb_{2/3})_{0.20}Ti_{0.48}Zr_{0.32}O_3$
I: $Pb(Sn_{1/3}Sb_{2/3})_{0.05}Ti_{0.55}Zr_{0.40}O_3$
J: $Pb(Sn_{1/3}Sb_{2/3})_{0.01}Ti_{0.47}Zr_{0.52}O_3$
K: $Pb(Sn_{1/3}Sb_{2/3})_{0.05}Ti_{0.43}Zr_{0.52}O_3$
L: $Pb(Sn_{1/3}Sb_{2/3})_{0.20}Ti_{0.33}Zr_{0.47}O_3$.

3. The electromechanical transducer element comprising a piezoelectric ceramic composition as claimed in claim 1.

4. The electromechanical transducer element comprising a piezoelectric ceramic composition as claimed in claim 2.

5. A piezoelectric ceramic material exhibiting high stability of resonant frequency with respect to temperature over the range of $-40°$ C. to $80°$ C. consisting of the solid solution having one of the following formulae:

$$Pb(Sn_{1/3}Sb_{2/3})_{0.05}Ti_{0.44}Zr_{0.51}O_3$$

or $$Pb(Sn_{1/3}Sb_{2/3})_{0.15}Ti_{0.44}Zr_{0.41}O_3.$$

6. The piezoelectric ceramic material of claim 5 having the formula:

$$Pb(Sn_{1/3}Sb_{2/3})_{0.15}Ti_{0.44}Zr_{0.41}O_3$$

having a change in resonant frequency with respect to temperature of 0.2% within the range of $-40°$ C. to $80°$ C.

* * * * *